US009110134B2

(12) United States Patent
Mak et al.

(10) Patent No.: US 9,110,134 B2
(45) Date of Patent: Aug. 18, 2015

(54) INPUT/OUTPUT DELAY TESTING FOR DEVICES UTILIZING ON-CHIP DELAY GENERATION

(71) Applicants: Tak M. Mak, Union City, CA (US); Christopher J. Nelson, Gilbert, AZ (US); David J. Zimmerman, El Dorado Hills, CA (US); Derek B. Feltham, Portland, OR (US)

(72) Inventors: Tak M. Mak, Union City, CA (US); Christopher J. Nelson, Gilbert, AZ (US); David J. Zimmerman, El Dorado Hills, CA (US); Derek B. Feltham, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 151 days.

(21) Appl. No.: 13/728,741

(22) Filed: Dec. 27, 2012

(65) Prior Publication Data
US 2014/0189457 A1    Jul. 3, 2014

(51) Int. Cl.
*G01R 31/30* (2006.01)
*G01R 31/317* (2006.01)

(52) U.S. Cl.
CPC ...... *G01R 31/31716* (2013.01); *G01R 31/3016* (2013.01)

(58) Field of Classification Search
USPC ........................................................ 714/745
See application file for complete search history.

(56) References Cited

U.S. PATENT DOCUMENTS

| | | | |
|---|---|---|---|
| 5,586,123 A | 12/1996 | Baker | |
| 5,621,739 A | 4/1997 | Sine et al. | |
| 5,869,983 A | 2/1999 | Ilkbahar et al. | |
| 6,348,811 B1 | 2/2002 | Haycock et al. | |
| 6,348,826 B1 | 2/2002 | Mooney et al. | |
| 6,424,926 B1 | 7/2002 | Mak | |
| 6,477,674 B1 | 11/2002 | Bates et al. | |
| 6,629,274 B1 | 9/2003 | Tripp et al. | |
| 6,671,847 B1 | 12/2003 | Chao et al. | |
| 6,889,350 B2 | 5/2005 | Fought et al. | |
| 6,898,741 B2 | 5/2005 | Muljono et al. | |
| 6,975,954 B2 | 12/2005 | Mak et al. | |

(Continued)

FOREIGN PATENT DOCUMENTS

KR    10-2011-0052205    5/2011

OTHER PUBLICATIONS

Author: Dongwoo Hong and Kwang-Ting (Tim) Cheng; Title: An Accurate Jitter Estimation Technique for Efficient High Speed I/O Testing; Publisher IEEE; Date: 2007 IEEE DOI 10.1109/ATS.2007. 77.*

(Continued)

*Primary Examiner* — April Y Blair
*Assistant Examiner* — Thien D Nguyen
(74) *Attorney, Agent, or Firm* — Blakely, Sokoloff, Taylor & Zafman LLP

(57) ABSTRACT

I/O delay testing for devices utilizing on-chip delay generation. An embodiment of an apparatus includes I/O buffer circuits, at least one of the buffer circuits including a transmitter and a receiver that are coupled for loop-back testing of the buffer circuit; and testing circuitry for the loop-back testing for the at least one buffer circuit, the loop-back testing including determining whether test data transmitted by the transmitter of the buffer circuit matches test data received by the respective coupled receiver. The testing circuitry includes a delay line to provide delay values from a transmit clock signal for the testing of the at least one buffer circuit, a counter to provide a count to choose one of the plurality of delay values, and test logic for the loop-back testing.

27 Claims, 12 Drawing Sheets

(56) References Cited

U.S. PATENT DOCUMENTS

| | | |
|---|---|---|
| 7,002,365 B2 | 2/2006 | Kakizawa et al. |
| 7,036,055 B2 | 4/2006 | Muljono et al. |
| 7,139,957 B2 | 11/2006 | Querbach et al. |
| 7,188,284 B2 | 3/2007 | Mitra et al. |
| 7,228,515 B2 | 6/2007 | Querbach et al. |
| 7,496,803 B2 | 2/2009 | Khondker et al. |
| 7,519,891 B2 | 4/2009 | Zimmerman |
| 7,640,474 B2 * | 12/2009 | Seibold ............ 714/727 |
| 7,814,386 B2 * | 10/2010 | Seibold et al. ........ 714/733 |
| 8,432,768 B2 | 4/2013 | Ware et al. |
| 2002/0184581 A1 | 12/2002 | Komatsu |
| 2003/0005374 A1 | 1/2003 | Fought et al. |
| 2003/0120989 A1 | 6/2003 | Zumkehr |
| 2006/0056269 A1 * | 3/2006 | Chiba ............ 365/233 |
| 2006/0236183 A1 | 10/2006 | Zerbe et al. |
| 2007/0291830 A1 | 12/2007 | Hori |
| 2008/0143396 A1 * | 6/2008 | Nishida ............ 327/146 |
| 2008/0205170 A1 | 8/2008 | Ikeda |
| 2009/0039867 A1 * | 2/2009 | Saint-Laurent et al. ...... 324/102 |
| 2009/0103443 A1 | 4/2009 | Ku et al. |
| 2009/0113264 A1 * | 4/2009 | Seibold et al. .......... 714/727 |
| 2009/0164856 A1 * | 6/2009 | Seibold ............ 714/718 |
| 2010/0017662 A1 | 1/2010 | Miller |
| 2014/0046616 A1 | 2/2014 | Cheng |
| 2014/0089752 A1 | 3/2014 | Nelson et al. |

OTHER PUBLICATIONS

International Search Report and Written Opinion of the International Searching Authority dated Nov. 25, 2013, in International Patent Application No. PCT/US2013/046198, 10 pages.

International Search Report and Written Opinion of the International Searching Authority in Application No. PCT/US2013/045796, Sep. 24, 2013.

Notice of Allowance for U.S. Appl. No. 13/625,744, dated May 5, 2014, 14 pages.

Supplemental Notice of Allowability dated Aug. 14, 2014, in U.S. Appl. No. 13/625,744, 9 pages.

* cited by examiner

INPUT/OUTPUT DELAY TESTING FOR DEVICES UTILIZING ON-CHIP DELAY GENERATION

TECHNICAL FIELD

Embodiments of the invention generally relate to the field of electronic devices and, more particularly, input/output delay testing for devices utilizing on-chip delay generation.

BACKGROUND

Testing of integrated circuit (IC) devices to ensure proper operation may include testing of I/O (input/output) buffer circuitry. For example, testing may include a test of DRAM (Dynamic Random Access Memory) I/O buffer circuitry. Testing may include testing according to U.S. patent application Ser. No. 13,625,744 entitled "Method, System, and Apparatus for Evaluation of Input/Output Buffer Circuitry".

In such testing, there may be operations for automated test equipment (ATE) to provide certain testing operations for DRAM memory, including testing of the response of memory IO interfaces to varying signal delay.

However, testing equipment may not support test operations as needed to provide signal delay testing. In particular, older ATE may be unable to provide sufficient timing edge resolution for certain delay testing of the IO interfaces of integrated circuit devices.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments of the invention are generally directed to input/output delay testing for devices utilizing on-chip delay generation.

In some embodiments, an apparatus, system, or method provides for loopback testing of computer memory I/O utilizing a mechanism that includes on-chip delay generation. In some embodiments, a chip includes an on-chip delay line for use in delay testing of I/O buffers.

In some embodiments, one or more of a plurality of I/O buffer circuits are tested to detect issues regarding buffer operation, where the I/O buffer circuits may share one or more common clock signals. In an example, respective data may be launched from each of the plurality of I/O buffer circuits with a common transmit clock signal, with respective data being received by each of the plurality of I/O buffer circuits with a common receive clock signal, where the common receive clock is generated by delaying the transmit clock using an on-chip delay line.

In some embodiments, an apparatus, system, or method includes one or more sweeps of loop-back tests for a plurality of I/O buffer circuits, where the one or more sweeps of loop-back tests are performed using increasing delay times, decreasing delay times, or both between the common transmit clock signal and the common receive clock signal, as delayed by the on-chip delay line.

In some embodiments, evaluating the result of a test may include determining, for each of the plurality of I/O buffer circuits, whether loop-back testing of the I/O buffer circuit indicates a fail condition, where a fail condition is a failure of a match between a transmitted signal and a received signal. In some embodiments, based on such determining for each of the plurality of I/O buffer circuits, one or more output signals may be produced to indicate a result, where the output signals may include a passing state for all I/O buffer circuits (for example, All_pass='1'), failure of at least one I/O buffer circuit (All_pass='0'), a failure of I/O buffer circuits (for example, All_fail='1'), or a failure of at least one I/O buffer circuit (All_fail='0').

In some embodiments, a plurality of I/O buffer circuits are included in an integrated circuit, such as where evaluation of the plurality of I/O buffer circuits is performed during wafer probe testing. For example, such evaluation may be performed when there are no package pins connected to the integrated circuit, when the integrated circuit resides on a die that has not yet been assembled with any other die, or both. In some embodiments, the plurality of I/O buffer circuits may be evaluated while in an assembly of multiple dies, while in a package, or in a similar arrangement.

In some embodiments, an apparatus, system, or method provides for calibration of the delay generated by an on-chip delay line.

Figure 1:
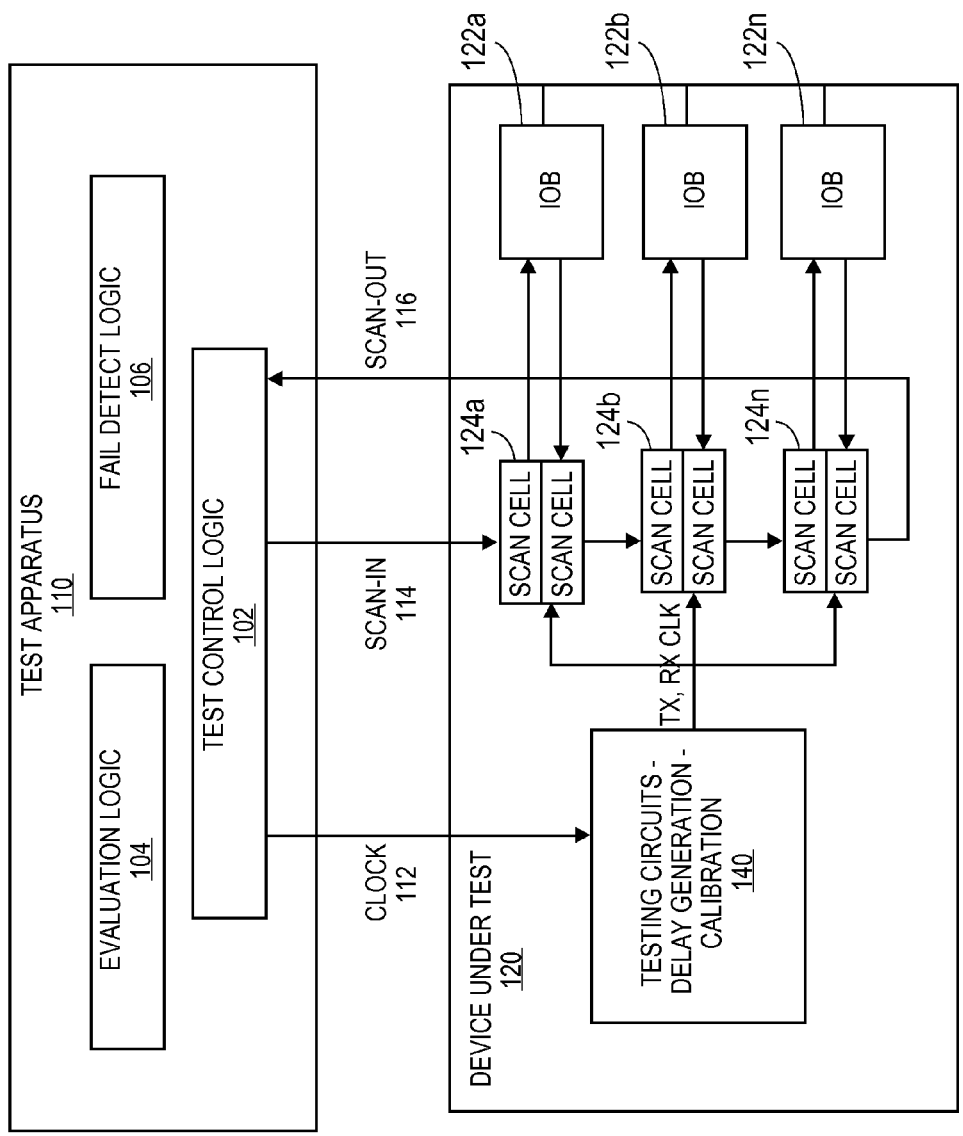
FIG. 1 illustrates an embodiment of a system for testing an integrated circuit.

FIG. 1 illustrates an embodiment of a system for testing an integrated circuit. A system may include a test apparatus 110 and a device 120 including an integrated circuit (IC) that is subject to evaluation by test apparatus 110. In an alternate embodiment, the functionality of test apparatus 110 is implemented in multiple separate devices.

Device 120 may be an IC to be evaluated, a package including such an IC, a DIMM (Dual In-line Memory Module) or other device including such a package and/or the like. The integrated circuit evaluated by test apparatus 110 may, for example, include random-access memory (RAM) such as one or more of dynamic RAM (DRAM), Double-Data-Rate DRAM (DDRAM), synchronous DRAM (SDRAM), static RAM (SRAM), flash memory, content addressable memory (CAM), polymer memory (e.g., ferroelectric polymer memory), phase-change memory (e.g., ovonic memory), silicon-oxide-nitride-oxide-silicon (SONOS) memory, or any other type of integrated circuit logic suitable for storing information.

In an embodiment, device 120 includes I/O buffer (IOB) circuits 122a, 122b, . . . , 122n which, during normal (or "mission mode") operation of device 120, are at various times to receive data for device 120 and/or send data from device 120. Evaluation of an integrated circuit of device 120 may include test apparatus 110 performing respective loop-back testing for at least one of IOB circuits 122a, 122b, . . . , 122n. For example, test apparatus 110 may perform multiple loop-back tests for one or more of IOB circuits 122a, 122b, . . . , 122n, each loop back test for a respective delay (or "skew") between a transmit clock and a receive clock which variously regulate respective operations of IOB circuits 122a, 122b, . . . , 122n.

By way of illustration and not limitation, test apparatus 110 may comprise test control logic 102—e.g. including hardware, firmware and/or executing software—to provide test data via scan in 114 to scan chain (SC) modules 124a, 124b, . . . , 124n including scan cells. While SC modules 124a, 124b, . . . , 124n are illustrated as being incorporated into device 120, certain embodiments are not limited in this regard. Based on test data, SC modules 124a, 124b, . . . , 124n may each input various data to a different respective one of IOB circuits 122a, 122b, . . . , 122n and each receive various associated output data from the different respective one of IOB circuits 122a, 122b, . . . , 122n. For example, SC 124a may input respective data to IOB 122a, where such input is regulated by a transmit clock TxClk. Alternatively or in addition, each SC 124 may receive from IOB 122 output data based on the input data, where such receiving is regulated by a receive clock RxClk. In some embodiments, RxClk is generated by testing circuit 140, where the generation of RxClk includes use of an on-chip delay line. The testing circuit 140 may receive a clock signal 112 from the test control logic 102, the RxClk being based on the clock signal 112

In some embodiments, test control logic 102 controls sending of a first set of data via scan-in link 114 as part of test data, where the first set of data is a basis of loop-back testing of IOB circuits 122a, 122b, . . . , 122n. In some embodiments, the testing circuit provides for sweeping through various delay values for the loop-back testing, where the delay values are generated using the on-chip delay line.

Based on the various input data each for a respective one of IOB circuits 122a, 122b, . . . , 122n and the various associated output each from a respective one of IOB 122, SC modules 124a, 124b, . . . , 124n may provide to test apparatus 110 information indicating respective loop-back test results for IOB circuits 122a, 122b, . . . , 122n via scan-out link 116. By way of illustration and not limitation, SC 124a may provide an output signal that is based on loop-back test exchanges between SC 124a and IOB 122a. Alternatively or in addition, test apparatus 110 may similarly receive an output signal based on loop-back test exchanges between SC 124b and IOB 122b, an output signal based on loop-back test exchanges between SC 124n and IOB 122n, and/or the like. The output signals may each include respective one or more values that are each for a different respective loop-back test of a given test round. Such one or more values of an output signal may be both specific to a particular test round and specific to a particular I/O buffer circuit tested repeatedly during that test round. In another embodiment, output signals are additionally provided as feedback to the scan chain comprising SC modules 124a, 124b, . . . , 124n.

Based on the output signals, test apparatus 110 may evaluate whether device 120 satisfies one or more test criteria. By way of illustration and not limitation, test apparatus 110 may include evaluation logic 104 and fail detect logic 106—e.g. including hardware, firmware and/or executing software—to determine whether a fail condition is indicated by any of the output signals. The fail condition may include an IOB module failing at least one of its loop-back tests in a test round. In an embodiment, the fail condition includes an IOB module failing each of its loop-back tests in a test round.

In some embodiments, an apparatus, system, or method provides the following:

(1) Measurement of a delay between pass and failure condition, between "all pass" to "all fail", utilizing an on-chip delay generator to generate a receiver clock from the transmit clock;

(2) A calibration mechanism, where the calibration mechanism may be used to allow use of a low cost delay line for the on-chip delay generator.

In some embodiments, a delay generator will generate the receiver clock from the transmit clock, where the transmit clock is supplied by ATE. In some embodiments, high precision signaling is not required for test operation. In some embodiments, by selecting an appropriate tap position of the delay line, an apparatus, system, or method may be utilized to control the amount of time allowed between the transmission and reception of data bits.

Figure 2:
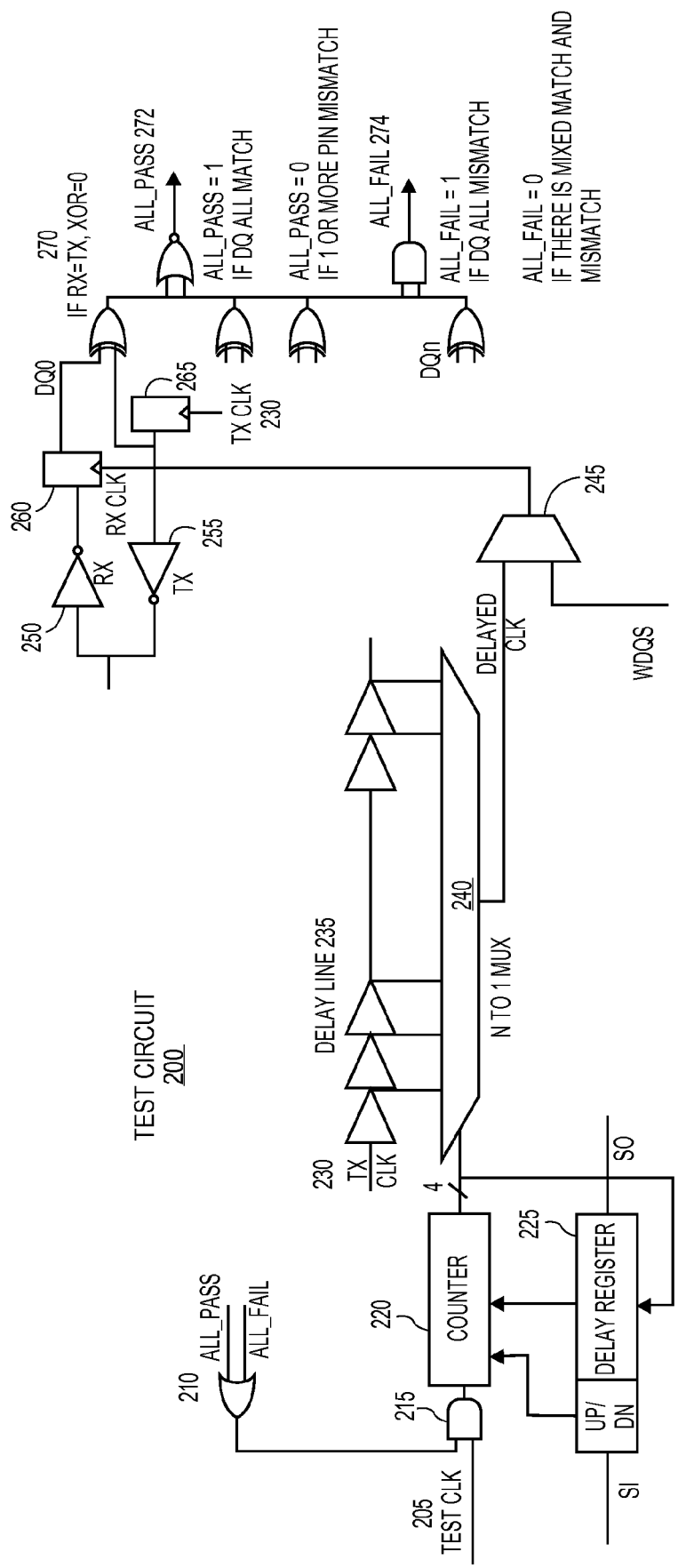
FIG. 2 illustrates an embodiment of a test circuit and delay generator for testing of memory I/O.

FIG. 2 illustrates an embodiment of a test circuit 200 and delay generator for testing of memory I/O. In some embodiments, a delay generator is coupled with a counter that controls a tap position of the delay generator. In some embodiments, the delay generator allows for sweeping the receiver clock in a test mode. In some embodiments, the apparatus allows for capturing the delay count into a scan chain to allow for capturing the count between, for example, "all pass" to "first fail", and from "all fail" to "first pass". In some embodiments, the difference between these two counts, from first fail to first pass, is the distribution of the edge transitions represented by the number of delay stages. If the delay of each delay stage is known, then the actual edge distribution can be determined.

In some embodiments, a loopback is provided for a first I/O buffer between a first transmitter 255, which receives a signal from a transmitter latch 265 clocked by a transmit clock 230, and a first receiver 250, which provides an input to a receiver latch 260 clocked by a receive clock, where the receive clock is a delayed clock derived using the transmit clock 230. The first transmitter 255 and the first receiver 250 are a portion of a first I/O buffer circuit of a plurality of I/O buffer circuits to be tested, which are illustrated in FIG. 2 as continuing through n circuits.

In some embodiments, a test clock 205 (which may be a low frequency, free running clock for test) is provided as a first input to AND logic (where logic indicates a logic gate or other logic components to produce a logic result) 215, where a second input to the AND logic 215 is an output of an OR logic 210 receiving a first input of All_pass and a second input of All_fail. An output of the AND logic 215 provides an enable input to a counter 220, the counter also receiving two inputs from a delay register 225, wherein a first input is to switch the counter between counting up or counting down and the second input is to provide a delay value to the counter from a delay register. An output of the counter, illustrated here as a four-bit output, is provided to an N to 1 multiplexer 240 to choose one of N inputs. In some embodiments, the N inputs to the multiplexer are N taps from an on-chip delay line 235, wherein the delay line is composed of N or more buffers or inverters. In some embodiments, the delay line 235 receives an input of the transmit clock 230, and thus the delay line provides N different delays of the transmit clock to generate a delayed clock.

In some embodiments, an output of the multiplexer 240 is a first input to a multiplexer, wherein the other input is write data strobe signal WDQS. In some embodiments, an output of the multiplexer 245 is a delayed clock signal RxClk to the receiver latch 260 of the first I/O buffer circuit), the receiver latch 260 producing data signal DQ0, with the remaining I/O buffer circuits producing data signals DQ1 through DQn, as illustrated in FIG. 2. The transmitter 255 receives the transmit clock TxClk and a test data input (not shown here). In some embodiments, the output of the receiver latch 260 and the transmitter latch 265 are the inputs to the first XOR logic of test logic 270. As provided, if the two values match (Rx=Tx), then the first XOR logic will provide a logical '0' value and if the two values do not match, then the first XOR logic will provide a logical '1' value. The values of the outputs of all of the XOR logic are provided as inputs to a NOR "All_pass" logic 272 and an AND "All-fail" logic 274 of the test logic 270. Thus, if all signals indicate a match (Rx=Tx), then All_pass='1', and if any signal indicates a mismatch, All_pass='0'. Further, if all signals indicate a mismatch, All_fail='1', and if any signal matches, All_fail='0'.

In some embodiments, a test sequence for the test circuit 200 illustrated in FIG. 2 includes:

(1) Loading a maximum (sufficiently large) delay value, where the value allows ample time from launch to capture, thus beginning at a point of all signals passing, where All_pass='1'.

(2) Count down and repeat the launch and capture sequence until one or more bits mismatch, thus reaching the point of a first fail, and thus All_pass='0'.

(3) The logic register contains the delay count for the "first fail", and this is unloaded back onto the scan chain for observation.

(4) Reload a minimum (sufficiently small) delay value, where the minimum delay value is so short of a delay that all pins will mismatch, which is a point of all signals failing, and thus All_fail='1'.

(5) Count up and repeat the launch and capture sequence until one or more pins are passing, thus reaching a point of a first pass, and thus "All_fail"='0'

(6) The logic register contains the delay count for the "first pass", and this is unloaded back onto the scan chain for observation.

Figure 3A:
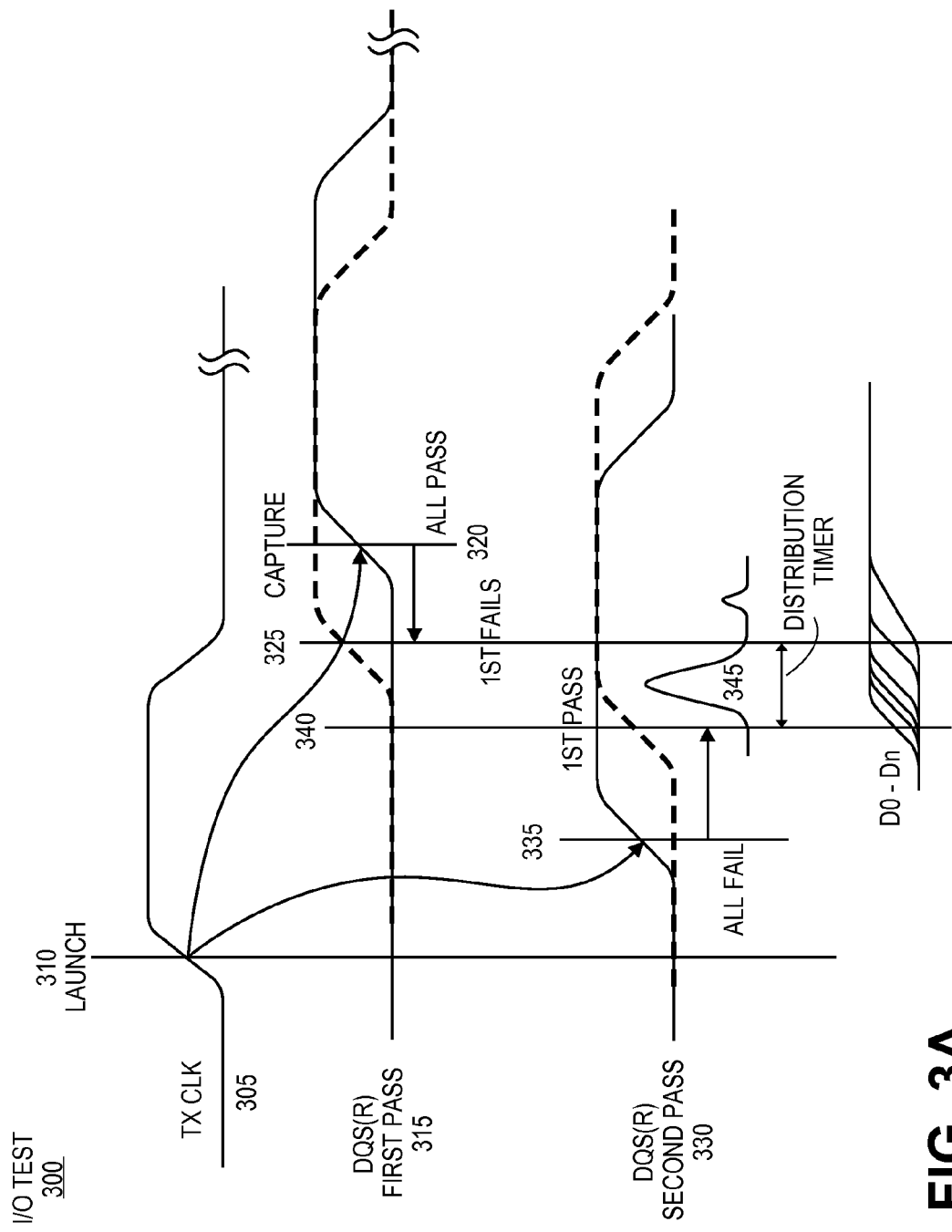
FIG. 3A is an illustration of timing relationships in an embodiment with an internally generated receiver clock being swept through a series of delay values.

FIG. 3A is an illustration of timing relationships in an embodiment with an internally generated receiver clock being swept through a series of delay values. FIG. 3A illustrates operations for determination of the points of first pass and first fail in an I/O test 300. As illustrated, a transmit clock 305 is launched 310, with a first cycle being shown. In some embodiments, a rising signal DQS(R) is generated by the delay line, such as shown in FIG. 2. The falling signal DQS(F) would be delayed a similar amount of time as the rising signal. In a first pass with DQS(R) 315, the delay is initially provided at a delay time 320 that is sufficiently large for all signal to pass and match. In the first pass, the delay is gradually reduced until a first fail is reached at a certain delay time 325. In a second pass with DQS(R) 330, the delay is initially provided at a delay time 335 that is short enough such that all signals mismatch and "fail". In the second pass, the delay is gradually increased until a first pass is reached at a certain delay time 340. The testing thus establishes the period between first fail and first pass. In some embodiments, testing may include comparing the distribution of all the data edges, which are indicated by the distribution 345 of these failure points, such as point at which a first fail occurs, to a point at which it first pass.

In some embodiments, a distribution is measured in terms of how much a signal timing edge has moved, thus signal channel resolution.

Figure 3B:
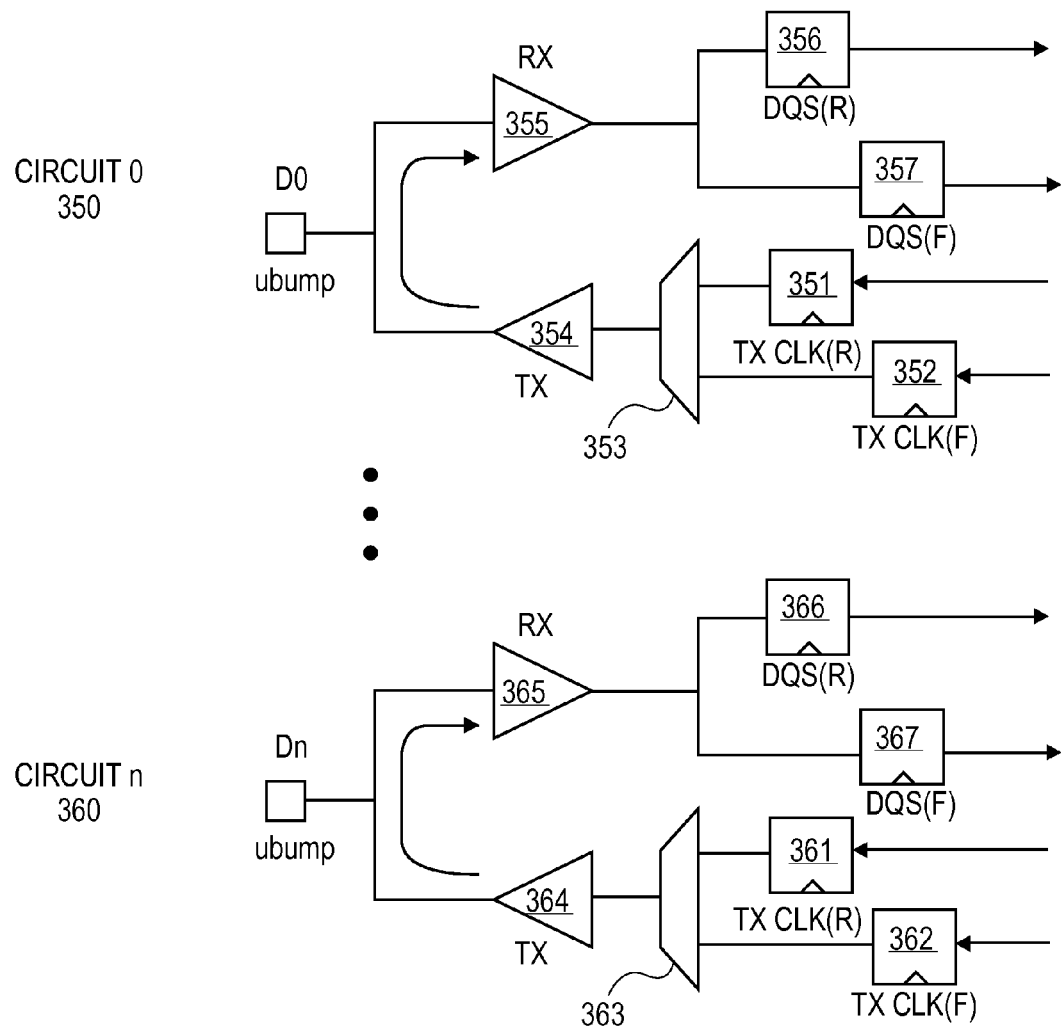
FIG. 3B is an illustration of an embodiment of I/O buffer circuits in a memory.

FIG. 3B is an illustration of an embodiment of I/O buffer circuits in a memory. In this illustration, n+1 circuits are included, including Circuit 0 (350) through Circuit n (360). As illustrated, each circuit includes a loopback connection between a transmitter, 354 and 364, and a receiver, 355 and 365. As illustrated, there is delayed rising edge signal and a delayed failing edge signal. In some embodiments, either a signal from latch 351/361 clocked by rising clock edge TX CLK (R) or a signal from latch 352/362 clocked by falling clock edge TX CLK(F) is selected by multiplexer 353/363 for transmission by transmitter 354/364. In some embodiments, a loopback signal received by receiver 355/365 is captured by latch 356/366 clocked by delayed rising edge DQS(R) or by latch 357/367 clocked by delayed falling edge signal DQS(F).

In some embodiments, a delay line for a device is composed simply of inverters or buffers. Compensated delay lines require custom design effort and require significant amounts of die area for control voltage regulation and overall stability. In an embodiment of the invention, because the delay line is not compensated, the delay that is provided by a inverter or buffer may vary with process variation. In some embodiments, calibration is provided for an on-chip delay line, where the calibration provides for identifying the amount of delay that will be provided at a tap of the delay line. In some embodiments, methods for calibrating a delay line include:

(1) Phase comparison of the transmit clock with all later stages of the delay line, with the assumption that the delay line is configured to provide an overall delay that is more than a cycle of the transmitter clock. In some embodiments, the captured comparison outcome shows at what bit position the two edges align, thereby identifying a tap that provides a delay of one transmit clock cycle, where individual delay stage values can be estimated by dividing the period by the number of delay taps that match up to the whole clock period.

(2) Use of a ring oscillator that is created out of the delay line, or use of another programmable delay, across the delay line. In some embodiments, a simple counter is used to capture the count within a specified time so that per stage delay can be deduced.

Figure 4:
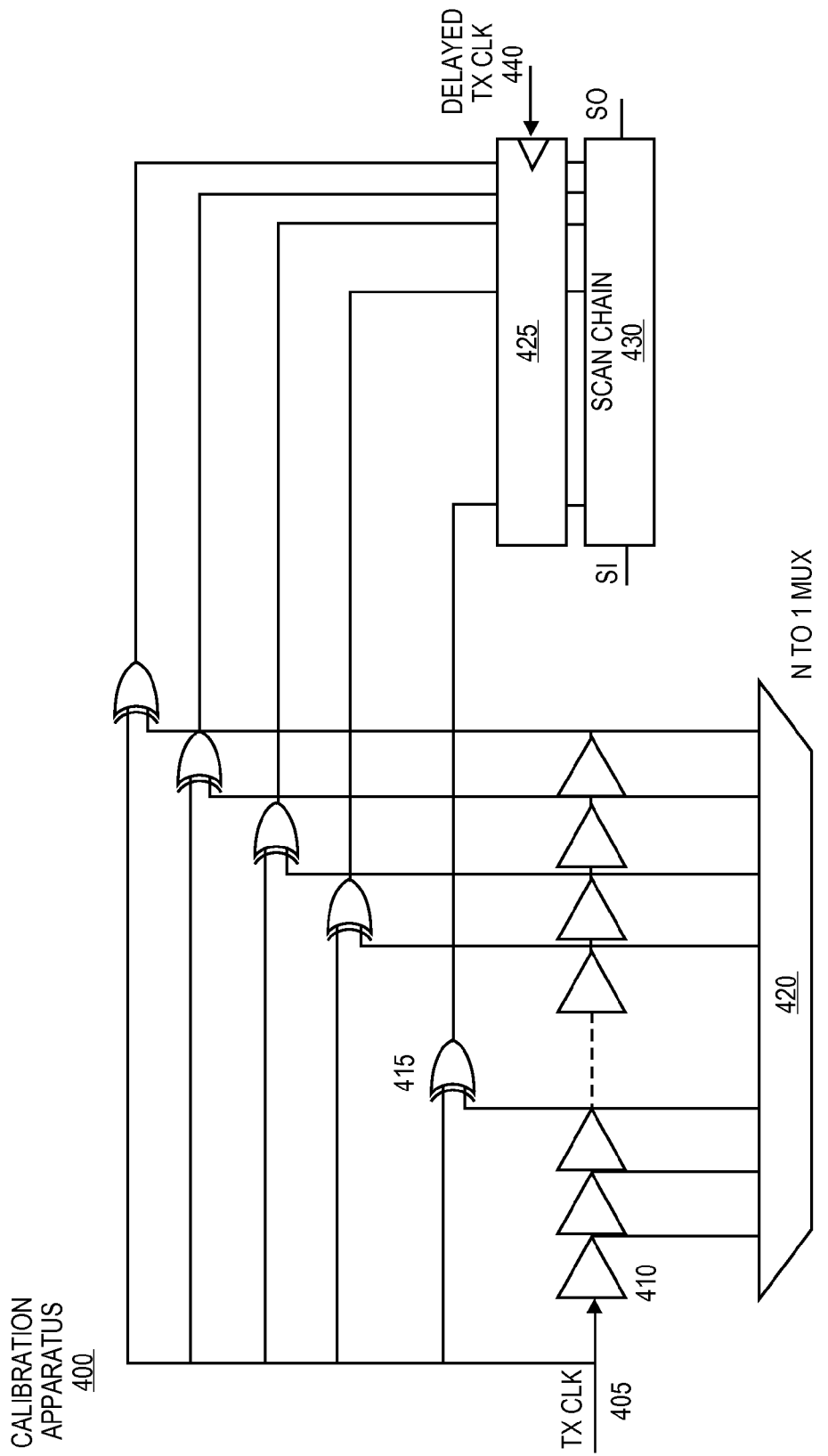
FIG. 4 illustrates an embodiment of an apparatus or system providing for calibration utilizing phase comparison with a delay clock.

FIG. 4 illustrates an embodiment of an apparatus or system providing for calibration utilizing phase comparison with a delay clock. In some embodiments, a calibration apparatus or system 400 uses phase comparison between a transmitter clock signal with the later stages for the delay line, where the delay line is designed to provide an overall delay of more than a transmitter clock cycle. In some embodiments, the captured comparison outcome shows at what bit position two edges are aligned indicating that delayed clock is aligned with the next clock edge.

In this illustration, a transmitter clock is provided to a delay line 410 composed of a plurality of inverters or buffers. In some embodiments, the transmitter clock 405 is further provided to a first terminal of each of a plurality of XOR logic 415, where a second terminal of each of the XOR logic is coupled with an output of the delay line 410 as well as an N to 1 multiplexer 420, where the bit position of the multiplexer 420 indicates the stage of the delay line that aligns with the next clock edge. An output of each of the XOR logic is provided to a latch 425 that is clocked by a delayed transmitter line 440. The latch bit position is then loaded onto a scan chain 430.

Figure 5:
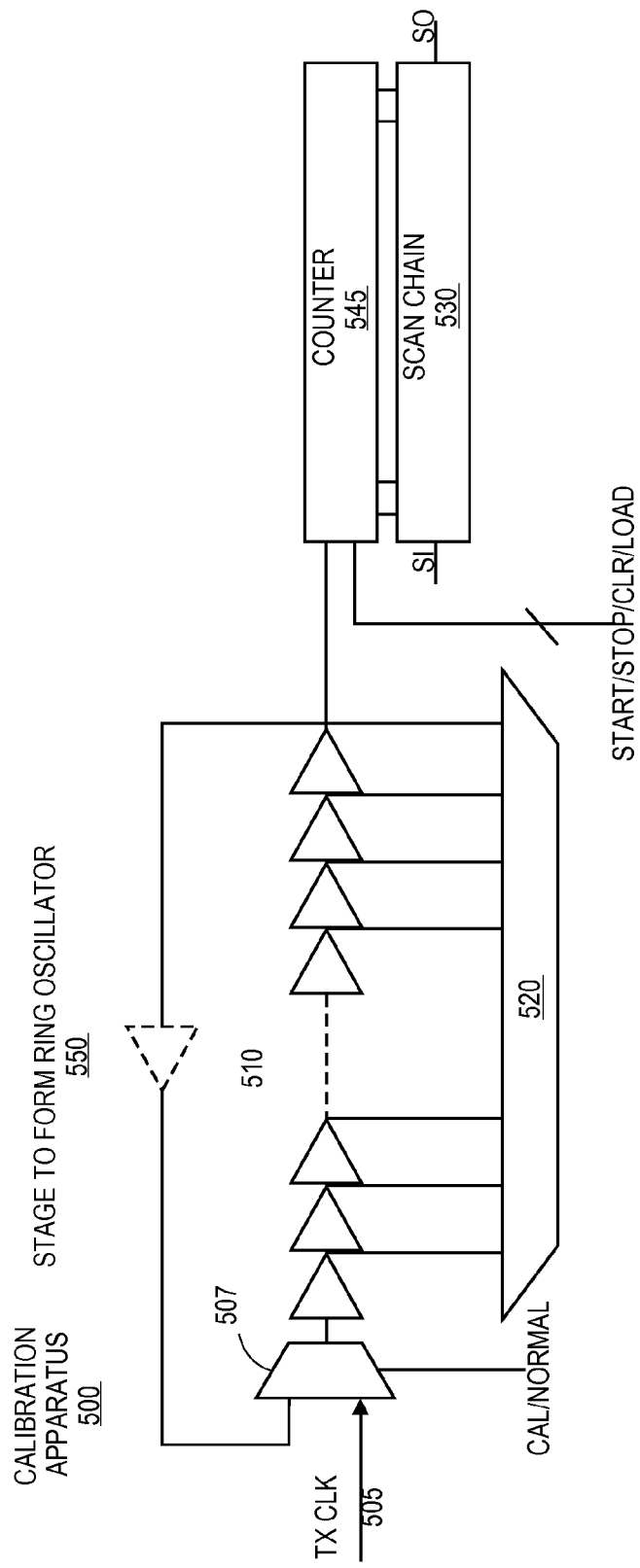
FIG. 5 illustrates an embodiment of a delay line including a ring oscillator for calibration.

FIG. 5 illustrates an embodiment of a delay line including a ring oscillator for calibration. In some embodiments, a calibration apparatus or system 500 is provided to create a ring oscillator out of a delay line. In some embodiments, a simple counter is used to capture the count within a specified time such that the per stage delay can be deduced.

In this illustration, a transmit clock 505 is provided to a multiplexer 507, where the multiplexer switches from a first mode for normal operation and second mode for calibration. In some embodiments, an output of the multiplexer 507 is provided to a delay line 510 composed of a plurality of inverters or buffers coupled with multiplexer 520. In some embodiments, an output of the delay line 510 is provided to a first input of a counter 545 coupled with scan chain 530, and a second input provides lines for start, stop, control, and load inputs. In some embodiments, a stage (which is added if necessary) of the delay line 510 in connected to form a ring oscillator 550. In some embodiments, the ring oscillator is used to determine the timing of the delay taps.

Embodiments are not limited to the use of a ring oscillator in such calibration of the delay line, and may include the use of other programmable delays for calibration, including, for example, a more complex delay element or timing generator.

Figure 6:
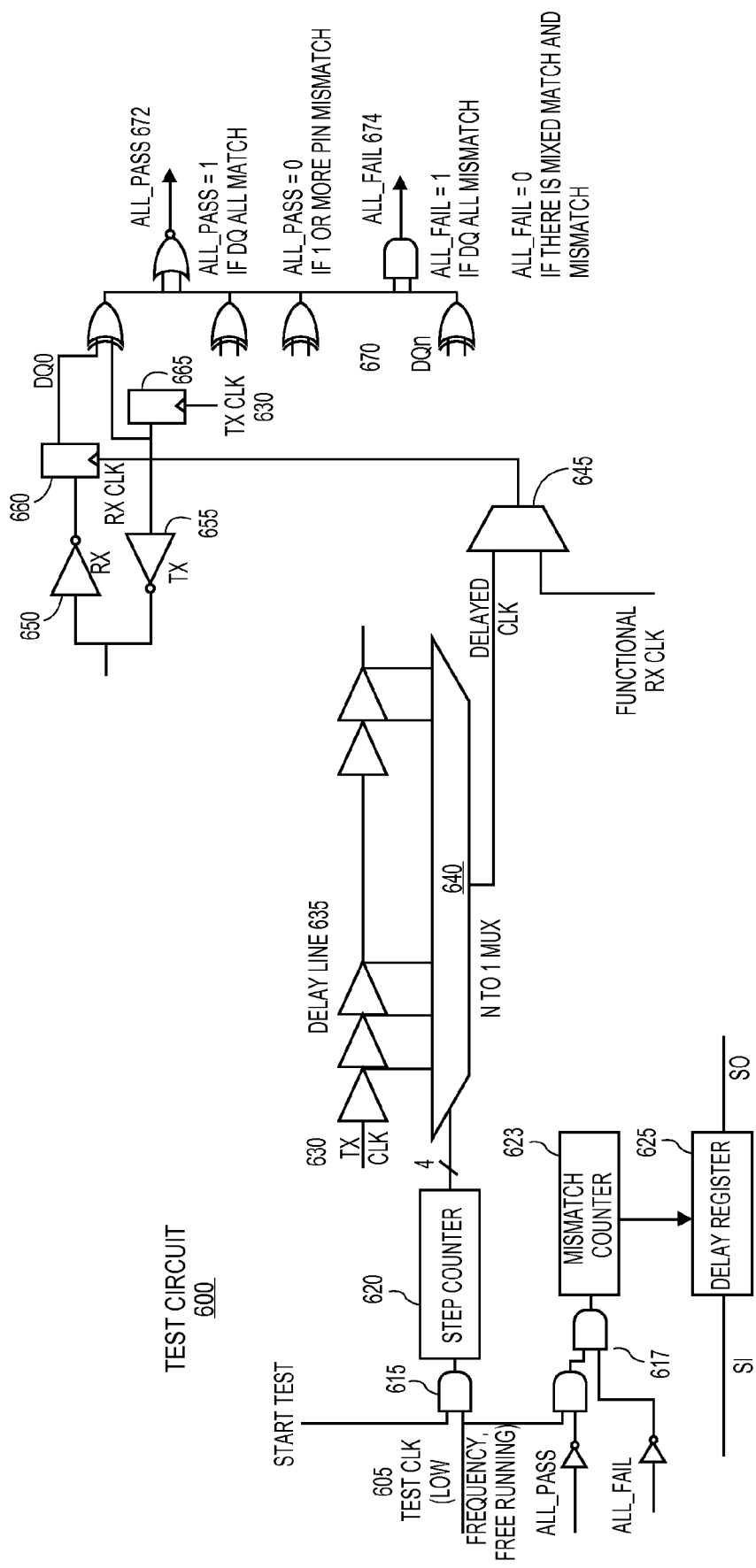
FIG. 6 illustrates an embodiment of apparatus or system to provide for a pass sweep for delay of a receiver clock.

FIG. 6 illustrates an embodiment of apparatus or system to provide for a single pass sweep for delay of a receiver clock. In some embodiments, an apparatus, system, or method sets up a "mismatch counter" to start counting when the output compare logic reports a mismatch, the counter then continue counting until all buffer circuits result in a mismatch. In some embodiments, the mismatch counter provides a difference between a delay resulting in a first failure to a delay resulting in all failure in a single sweep.

In some embodiments, a loopback is provided for a first I/O buffer between a first transmitter 655, which receives a signal from a transmitter latch 665 clocked by a transmit clock 630, and a first receiver 650, which provides an input to a receiver latch 660 clocked by a receive clock, where the receive clock is a delayed clock generated using the transmit clock 630. The first transmitter 655 and the first receiver 650 are a portion of a first I/O buffer circuit of a plurality of I/O buffer circuits for testing, which are illustrated in FIG. 6 as continuing through n circuits.

In some embodiments, a test clock 605 (which may be a low frequency, free running clock for test) is provided as a first input to an AND logic gate 615, where a second input to the AND logic 615 is a Start Test signal. An output of the AND logic 615 provides an enable input to a step counter 620, where an output of the step counter, illustrated here as a four-bit output, is provided to an N to 1 multiplexer 640 to choose one of N inputs. In some embodiments, the N inputs to the multiplexer are N taps from an on-chip delay line 635, wherein the delay line is composed of N or more buffers or inverters. In some embodiments, the delay line 635 receives an input of the transmit clock 630, and thus the delay line provides N different delays of the transmit clock to generate a delayed clock.

In some embodiments, an output of the multiplexer 640 is a first input to a multiplexer, wherein the other input is a functional receive clock. In some embodiments, an output of the multiplexer 645 is a delayed clock signal RxClk to the receiver latch 660 of the first I/O buffer circuit of the plurality of I/O buffer circuits, the receiver latch 660 producing data signal DQ0, with the remaining I/O buffer circuits producing data signals DQ1 through DQn, as illustrated in FIG. 6. The transmitter latch 665 receives the transmit clock TxClk 630 and a test data input (not shown here). In some embodiments, the output of the receiver latch 660 and the transmitter latch 665 are the inputs to a first XOR logic of a set of n+1 XOR logic elements of test logic 670 for the I/O buffer circuits. As provided, if the two values match (Rx=Tx), then the first XOR logic will provide a logical '0' value and if the two values do not match, then the first XOR logic will provide a logical '1' value. The values of the outputs of all of the XOR logic are provided as inputs to a NOR "All_pass" logic 672 and an AND "All-fail" logic 674 of the test logic 670. Thus, if all signals indicate a match (Rx=Tx), then All_pass='1', and if any signal indicates a mismatch, All_pass='0'. Further, if all signals indicate a mismatch, All_fail='1', and if any signal matches, All_fail='0'.

In some embodiments, the All_pass and All_fail signals are provided to a set of logic elements 617. As illustrated, the test clock 605 an inverted version of the All_pass are inputs to a first AND logic, and the output of the first AND logic and an inverted version of the All_fail signal are inputs to a second AND logic. In some embodiments, an output of the set of logic elements 617 is provided to a mismatch counter 623, which thus will only count when All_pass goes from '1' to '0', with the count then stopping when All_fail=1. In some embodiments, the count of the mismatch counter is stored in a delay register 625, which is also part of the scan chain.

In some embodiments, a test sequence for the test circuit 600 illustrated in FIG. 6 includes:

(1) Loading a maximum (sufficiently large) delay value that provides ample time from launch to capture into the step counter 620, thus beginning with all I/O buffer circuits providing a match.

(2) Count down the step counter and repeating the launch and capture of signals.

(3) When one or more mismatches occur, All_pass='0', the mismatch counter 623 starts counting.

(4) As the step counter is decremented, thereby shortening the launch and capture delay clock, more mismatches should occur.

(5) When all buffer circuits indicate a mistake (All-fail='1'), then the mismatch counter stops.

(6) Unload the mismatch counter value onto the delay register and shift out of the scan chain for observation.

Figure 7:
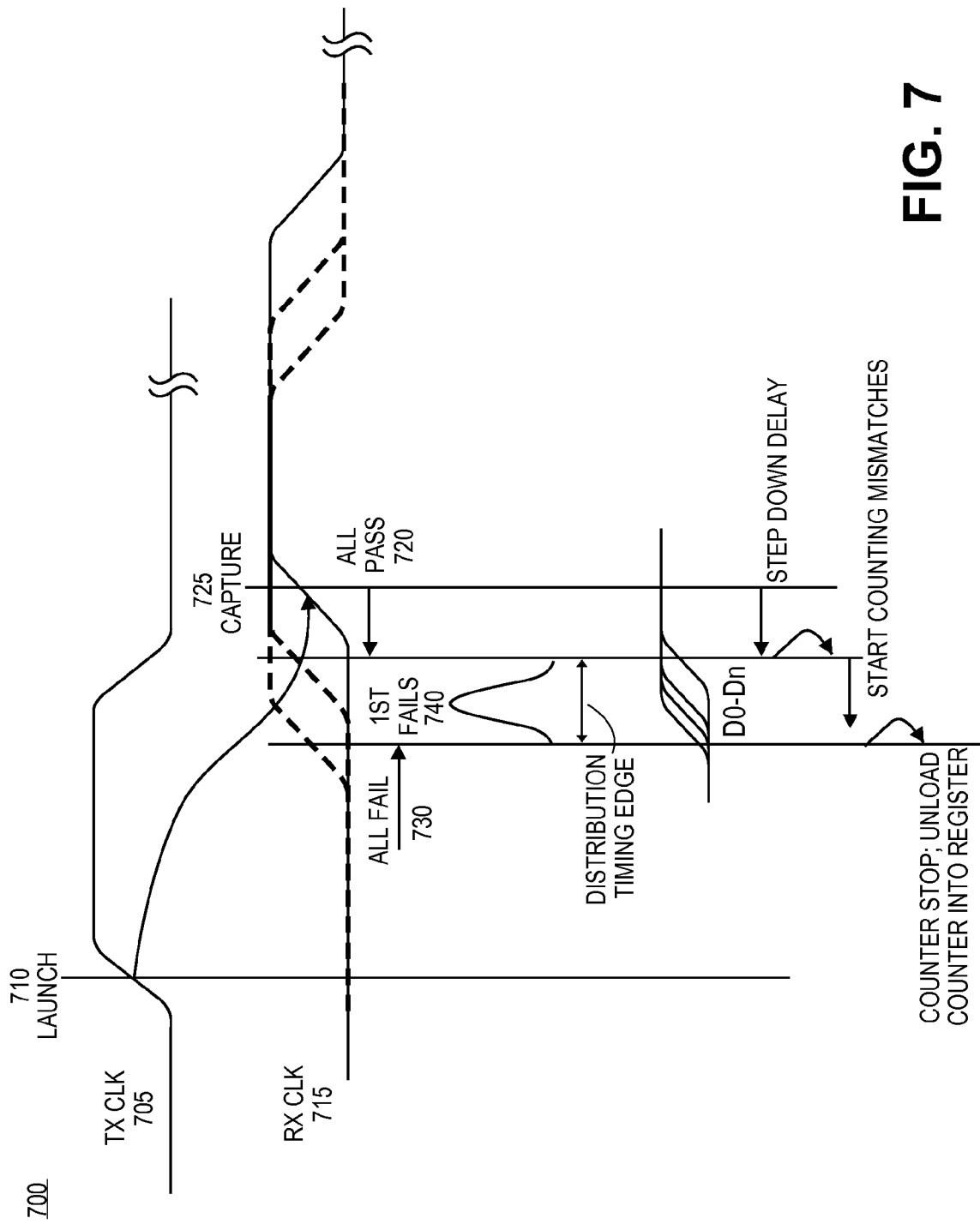
FIG. 7 illustrates timing relationships in an embodiment with an internally generated receiver clock being swept through a series of delay values.

FIG. 7 illustrates timing relationships in an embodiment with an internally generated receiver clock being swept through a series of delay values. FIG. 7 illustrates operations for determination of the points of first fail and all fail in an I/O test 700. As illustrated, a transmit clock 705 is launched at 710, with a first cycle being shown. In some embodiments, a rising signal DQS(R) or Rx Clk is generated by the delay line, such as shown in FIG. 6. The falling signal DQS(F) would be delayed a similar amount of time as the rising signal. In a first pass with the receive clock 715, the delay is initially provided at a delay time 720 that is sufficiently large for all signals to pass and match. In some embodiments, the delay is gradually reduced until a first fail is reached at a certain delay time 725. In some embodiments, a mismatch counter is enabled to begin counting at when the first fail is detected. The process then continues, with the delay being gradually decreased until all buffer circuits indicate failure 730, at which point the mismatch counter ceases counting, and the counter value is downloaded into a register for analysis. The testing thus establishes a period between first fail and all fail of I/O buffer circuits. In some embodiments, testing may include comparing the distribution 740 between a first fail to all fail values, or other such comparisons.

Figure 8:
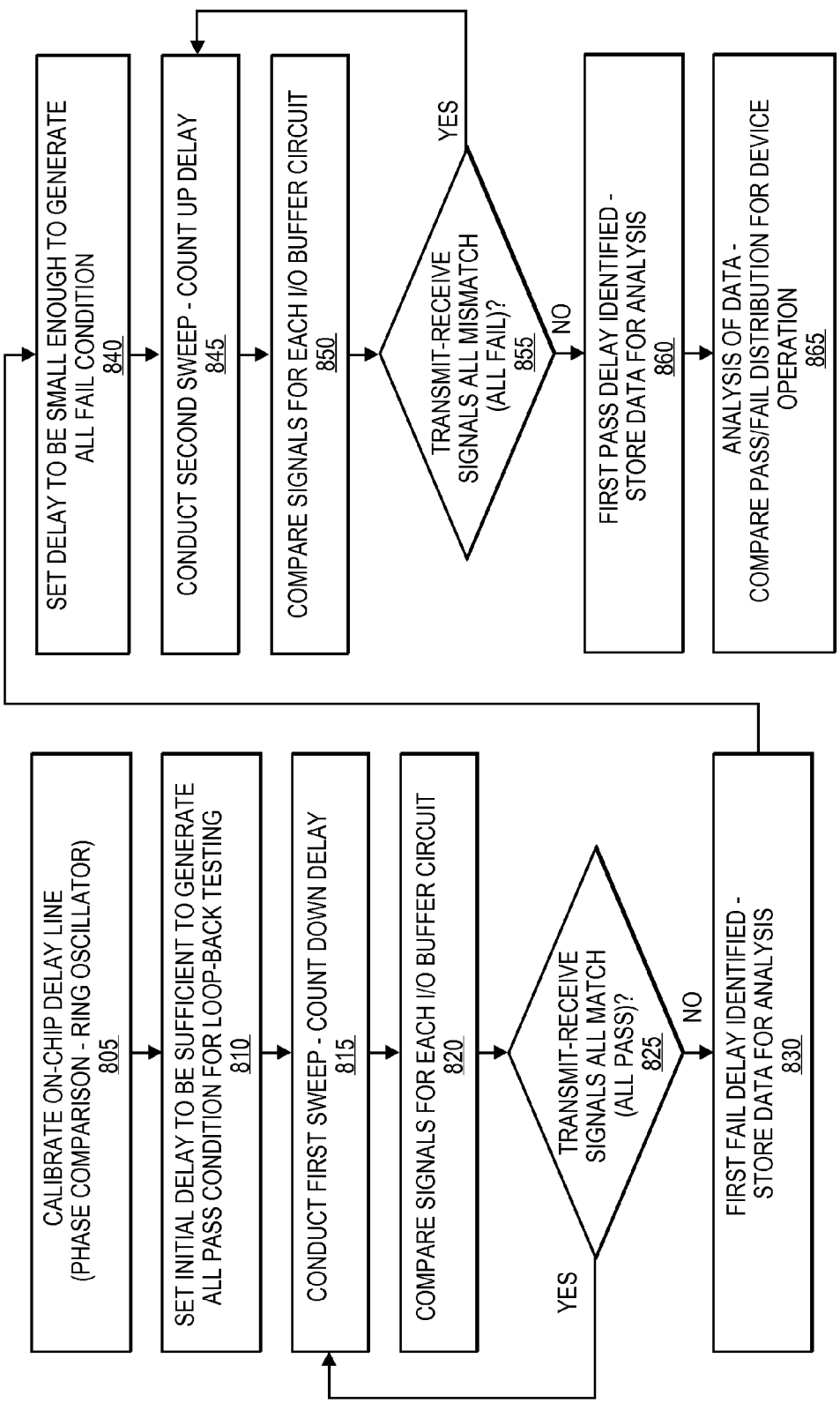
FIG. 8 illustrates an embodiment of a method for loop-back testing of I/O buffer circuits including sweeps of delay values.

FIG. 8 illustrates an embodiment of a method for loop-back testing of I/O buffer circuits including sweeps of delay values. In some embodiments, a method includes calibrating an on-chip delay line of a device under test 805. In some embodiments, the calibration may include phase comparison of a transmit clock utilizing the delay, such as illustrated in FIG. 4. In some embodiments, the calibration may include application of a ring oscillator or other programmable delay with the delay line, such as illustrated in FIG. 5.

In some embodiments, loop-back testing of a plurality of I/O buffer circuits includes setting an initial delay for the delay line that is sufficient to generate an All Pass condition for the loop-back test of the buffer circuits 810. The method then provides for conducting a first sweep of delay values for the delay line, with the amount of delay being counted down with each iteration 815. In some embodiments, the transmit and receiver signals are compared for each of the plurality of I/O buffer circuits 820. If the transmit signal and the receive signal match for all buffer circuits (All Pass) 825, then the process continues with counting down the delay value 815. If there is not an All Pass condition 825, i.e., there are one or more mismatches, then the First Fail delay value has been identified, and the data is stored for analysis 830.

In some embodiments, loop-back testing continues with setting an initial delay value that is small enough to ensure that all mismatches will occur (All Fail) 840. In some embodiments, the testing includes conducting a second sweep of delay values for the delay line, with amount of delay being counted up with each iteration 845. In some embodiments, the transmit and receiver signals are compared for each of the plurality of I/O buffer circuits 850. If the transmit signal and the receive signal mismatch for all buffer circuits (All Fail) 855, then the process continues with counting down the delay value 845. If there is not an All Fail condition 855, i.e., there are one or more matches, then the First Pass delay value has been identified, and the data is stored for analysis 860. In some embodiments, testing may continue with analysis of the stored data, such comparison of the results to a distribution of data results for various individual devices 865.

Figure 9:
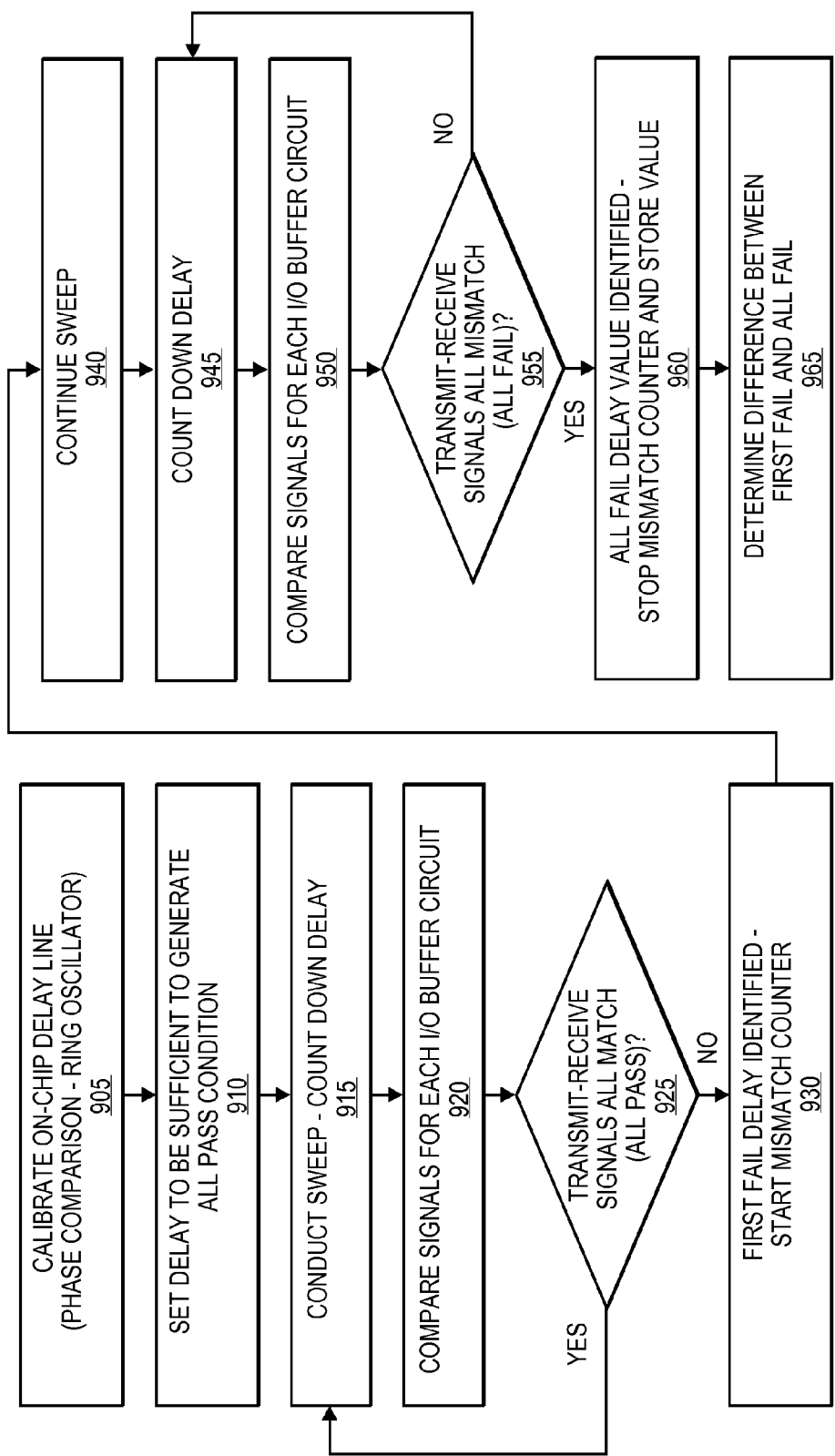
FIG. 9 illustrates an embodiment of a method for loop-back testing of I/O buffer circuits including a single sweep of delay values.

FIG. 9 illustrates an embodiment of a method for loop-back testing of I/O buffer circuits including a single sweep of delay values. In some embodiments, a method includes calibrating an on-chip delay line of a device under test 905. In some embodiments, the calibration may include phase comparison of a transmit clock utilizing the delay, such as illustrated in FIG. 4. In some embodiments, the calibration may include application of a ring oscillator or other programmable delay with the delay line, such as illustrated in FIG. 5.

In some embodiments, loop-back testing of a plurality of I/O buffer circuits includes setting an initial delay for the delay line that is sufficient to generate an All Pass condition for the loop-back test of the buffer circuits 910. The method then provides for conducting a single sweep of delay values for the delay line, with the amount of delay being counted down with each iteration 915. In some embodiments, the transmit and receive signals are compared for each of the plurality of I/O buffer circuits 920. If the transmit signal and the receive signal match for all buffer circuits (All Pass) 925, then the process continues with counting down the delay value 915. If there is not an All Pass condition 925, i.e., there are one or more mismatches, then the First Fail delay value has been identified, and a mismatch counter 623 (illustrated in FIG. 6) is started 930.

In some embodiments, the sweep of delay values is continued 940, and the delay value continues to count down with each iteration 945. In some embodiments, the transmit and receiver signals are compared for each of the plurality of I/O buffer circuits 950. If the transmit signal and the receive signal do not mismatch for all buffer circuits (All Fail is not yet reached) 955, then the process continues with counting down the delay value 945. If there is an All Fail condition 955 then the All Fail delay value has been identified, and the mismatch counter is stopped and the count value is stored 960, such as in a register (for example, delay register 625 illustrated in FIG. 6). In some embodiments, testing may continue with analysis of the stored data, such comparison of the results to a distribution of data results for various individual devices 965.

Figure 10:
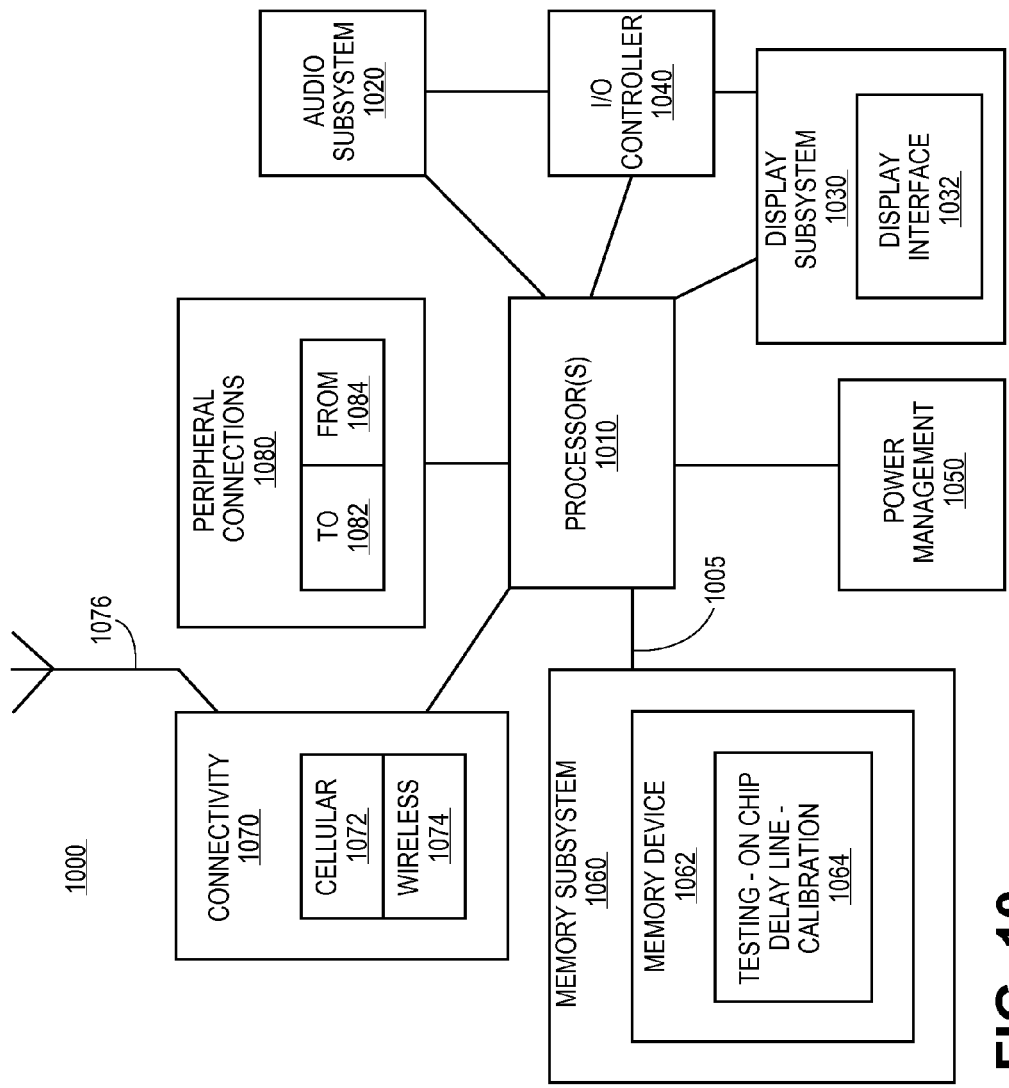
FIG. 10 illustrates an embodiment of an apparatus or system including on-chip generation of delay for I/O buffer testing.

FIG. 10 illustrates an embodiment of an apparatus or system including on-chip generation of delay for I/O buffer testing. Computing device 1000 represents a computing device including a mobile computing device, such as a laptop computer, a tablet computer (including a device having a touchscreen without a separate keyboard; a device having both a touchscreen and keyboard; a device having quick initiation, referred to as "instant on" operation; and a device that is generally connected to a network in operation, referred to as "always connected"), a mobile phone or smart phone, a wireless-enabled e-reader, or other wireless mobile device. It will be understood that certain of the components are shown generally, and not all components of such a device are shown in device 1000. The components may be connected by one or more buses or other connections 1005.

In some embodiments, memory subsystem 1060 includes memory devices for storing information in device 1000. The processor 1010 may read and write data to elements of the memory subsystem 1060. Memory can include nonvolatile (having a state that does not change if power to the memory device is interrupted), volatile (having a state that is indeterminate if power to the memory device is interrupted) memory devices, or both such memories. Memory 1060 can store application data, user data, music, photos, documents, or other data, as well as system data (whether long-term or temporary) related to the execution of the applications and functions of system 1000.

In some embodiments, the memory subsystem 1060 may include a memory device 1062, wherein the memory device includes elements for loop-back testing of I/O buffer circuit 1064, including an on-chip delay line. In some embodiments, the elements further include elements for calibration of the delay generated by the on-chip delay line.

In addition:

Device 1000 includes processor 1010, which performs the primary processing operations of device 1000. Processor 1010 can include one or more physical devices, such as microprocessors, application processors, microcontrollers, programmable logic devices, or other processing means. The processing operations performed by processor 1010 include the execution of an operating platform or operating system on which applications, device functions, or both are executed. The processing operations include operations related to I/O (input/output) with a human user or with other devices, operations related to power management, operations, or both related to connecting device 1000 to another device. The processing operations may also include operations related to audio I/O, display I/O, or both.

In one embodiment, device 1000 includes audio subsystem 1020, which represents hardware (such as audio hardware and audio circuits) and software (such as drivers and codecs) components associated with providing audio functions to the computing device. Audio functions can include speaker, headphone, or both such audio output, as well as microphone input. Devices for such functions can be integrated into device 1000, or connected to device 1000. In one embodiment, a user interacts with device 1000 by providing audio commands that are received and processed by processor 1010.

Display subsystem 1030 represents hardware (such as display devices) and software (such as drivers) components that provide a display having visual, tactile, or both elements for a user to interact with the computing device. Display subsystem 1030 includes display interface 1032, which includes the particular screen or hardware device used to provide a display to a user. In one embodiment, display interface 1032 includes logic separate from processor 1010 to perform at least some processing related to the display. In one embodiment, display subsystem 1030 includes a touch screen device that provides both output and input to a user.

I/O controller 1040 represents hardware devices and software components related to interaction with a user. I/O controller 1040 can operate to manage hardware that is part of audio subsystem 1020, a display subsystem 1030, or both such subsystems. Additionally, I/O controller 1040 illustrates a connection point for additional devices that connect to device 1000 through which a user might interact with the system. For example, devices that can be attached to device 1000 might include microphone devices, speaker or stereo systems, video systems or other display device, keyboard or keypad devices, or other I/O devices for use with specific applications such as card readers or other devices.

As mentioned above, I/O controller 1040 may interact with audio subsystem 1020, display subsystem 1030, or both such subsystems. For example, input through a microphone or other audio device can provide input or commands for one or more applications or functions of device 1000. Additionally, audio output can be provided instead of or in addition to display output. In another example, if display subsystem includes a touch screen, the display device also acts as an input device, which can be at least partially managed by I/O controller 1040. There can also be additional buttons or switches on device 1000 to provide I/O functions managed by I/O controller 1040.

In one embodiment, I/O controller 1040 manages devices such as accelerometers, cameras, light sensors or other environmental sensors, or other hardware that can be included in device 1000. The input can be part of direct user interaction, as well as providing environmental input to the system to influence its operations (such as filtering for noise, adjusting displays for brightness detection, applying a flash for a camera, or other features).

In one embodiment, device 1000 includes power management 1050 that manages battery power usage, charging of the battery, and features related to power saving operation.

Connectivity 1070 includes hardware devices (e.g., connectors and communication hardware for wireless communication, wired communication, or both) and software components (e.g., drivers, protocol stacks) to enable device 1000 to communicate with external devices. The device could be separate devices, such as other computing devices, wireless access points or base stations, as well as peripherals such as headsets, printers, or other devices.

Connectivity 1070 can include multiple different types of connectivity. To generalize, device 1000 is illustrated with cellular connectivity 1072 and wireless connectivity 1074. Cellular connectivity 1072 refers generally to cellular network connectivity provided by wireless carriers, such as provided via 4G/LTE (Long Term Evolution), GSM (global system for mobile communications) or variations or derivatives, CDMA (code division multiple access) or variations or derivatives, TDM (time division multiplexing) or variations or derivatives, or other cellular service standards. Wireless connectivity 1074 refers to wireless connectivity that is not cellular, and can include personal area networks (such as Bluetooth), local area networks (such as Wi-Fi), wide area networks (such as WiMax), and other wireless communications. Connectivity may include one or more omnidirectional or directional antennas 1076.

Peripheral connections 1080 include hardware interfaces and connectors, as well as software components (e.g., drivers, protocol stacks) to make peripheral connections. It will be understood that device 1000 could both be a peripheral device ("to" 1082) to other computing devices, as well as have peripheral devices ("from" 1084) connected to it. Device 1000 commonly has a "docking" connector to connect to other computing devices for purposes such as managing (such as downloading, uploading, changing, or synchronizing) content on device 1000. Additionally, a docking connector can allow device 1000 to connect to certain peripherals that allow device 1000 to control content output, for example, to audiovisual or other systems.

In addition to a proprietary docking connector or other proprietary connection hardware, device 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Figure 11:
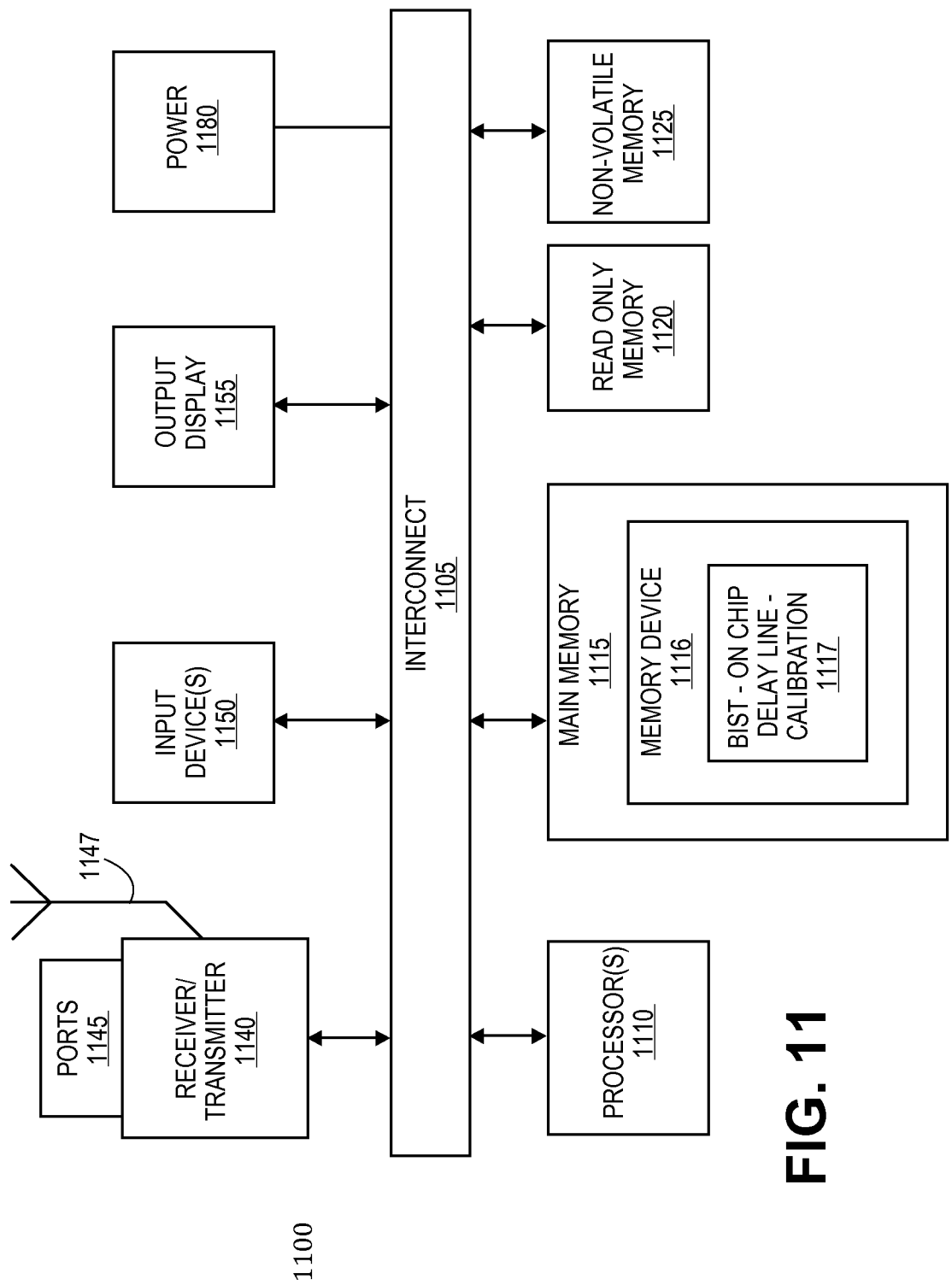
FIG. 11 illustrates an embodiment of a computing system including on-chip generation of delay for I/O buffer testing.

FIG. 11 illustrates an embodiment of a computing system including on-chip generation of delay for I/O buffer testing. The computing system may include a computer, server, game console, or other computing apparatus. In this illustration, certain standard and well-known components that are not germane to the present description are not shown. Under some embodiments, the computing system 1100 comprises an interconnect or crossbar 1105 or other communication means for transmission of data.

In some embodiments, the computing system 1100 further comprises a random access memory (RAM) or other dynamic storage device or element as a main memory 1115 for storing information and instructions to be executed by processors 1110. RAM memory includes dynamic random access memory (DRAM), which requires refreshing of memory contents, and static random access memory (SRAM), which does not require refreshing contents, but at increased cost. In some embodiments, main memory may include active storage of applications including a browser application for using in network browsing activities by a user of the computing system. DRAM memory may include synchronous dynamic random access memory (SDRAM), which includes a clock signal to control signals, and extended data-out dynamic random access memory (EDO DRAM). In some embodiments, memory of the system may include certain registers or other special purpose memory.

In some embodiments, the main memory 1115 includes a memory device 1116, wherein the memory device includes elements for loop-back testing of I/O buffer circuit 1117, including an on-chip delay line. In some embodiments, the elements 1117 further include elements for calibration of delay generated by the on-chip delay line.

In addition:

The computing system 1100 may include a processing means such as the one or more processors 1110 coupled with the interconnect 1105 for processing information. The processors 1110 may comprise one or more physical processors and one or more logical processors. The interconnect 1105 is illustrated as a single interconnect for simplicity, but may represent multiple different interconnects or buses and the component connections to such interconnects may vary. The interconnect 1105 shown in FIG. 11 is an abstraction that represents any one or more separate physical buses, point-to-point connections, or both connected by appropriate bridges, adapters, or controllers.

The computing system 1100 also may comprise a read only memory (ROM) 1120 or other static storage device for storing static information and instructions for the processors 1110. The computing system 1100 may include one or more nonvolatile memory elements 1125 for the storage of certain elements.

One or more transmitters or receivers 1140 may also be coupled to the interconnect 1105. In some embodiments, the computing system 1100 may include one or more ports 1145 for the reception or transmission of data. The computing system 1100 may further include one or more omnidirectional or directional antennas 1147 for the reception of data via radio signals.

In some embodiments, the computing system 1100 includes one or more input devices 1150, where the input devices include one or more of a keyboard, mouse, touch pad, voice command recognition, gesture recognition, sensors or monitors (including sensors or monitors providing power and performance data), or other device for providing an input to a computing system.

The computing system 1100 may also be coupled via the interconnect 1105 to an output display 1155. In some embodiments, the display 1155 may include a liquid crystal display (LCD) or any other display technology, for displaying information or content to a user. In some environments, the display 1155 may include a touch-screen that is also utilized as at least a part of an input device. In some environments, the display 1155 may be or may include an audio device, such as a speaker for providing audio information.

The computing system 1100 may also comprise a power device or system 1180, which may comprise a power supply, a battery, a solar cell, a fuel cell, or other system or device for providing or generating power. The power provided by the power device or system 1180 may be distributed as required to elements of the computing system 1100.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable storage medium having stored thereon computer program instructions, which may be used to program a computer (or other electronic devices) for execution by one or more processors to perform a process according to certain embodiments. The computer-readable medium may include, but is not limited to, floppy diskettes, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

In some embodiments, an apparatus includes a plurality of I/O buffer circuits, at least one of the plurality of buffer circuits including a transmitter and a receiver that are coupled for loop-back testing of the buffer circuit; and testing circuitry for the loop-back testing for the at least one buffer circuit, the loop-back testing including determining whether test data transmitted by the transmitter of the buffer circuit matches test data received by the respective coupled receiver. The testing circuitry includes a delay line to provide a plurality of delay values from a transmit clock signal for the testing of the at least one buffer circuit, a counter to provide a count to choose one of the plurality of delay values, and test logic for the loop-back testing.

In some embodiments, the test logic is to determine whether a result of the loop-back testing for the at least one buffer circuit is a match or a mismatch. In some embodiments, the test logic includes a first logic to determine whether all results of the loop-back testing are matches and a second logic to determine whether all results of the loop-back testing are mismatches.

In some embodiments, the apparatus includes a multiplexer, the multiplexer to receive the count to choose one of the plurality of delay values.

In some embodiments, the loop-back testing includes a first sweep of delay values wherein the counter counts down from a first initial delay value and a second sweep of delay values wherein the counter counts up from a second initial delay value. In some embodiments, the first initial delay value is a delay value for which the results of the loop-back testing are all matches, wherein the apparatus is to identify a first delay value for which one or more of the results of the loop-back testing are mismatches. the second initial delay value is a delay value for which the results of the loop-back testing are all mismatches, wherein the apparatus is to identify a first delay value for which one or more of the results of the loop-back testing are matches.

In some embodiments, the loop-back testing includes a single sweep of delay values wherein the counter counts down from an initial delay value. In some embodiments, the initial delay value is a delay value for which the results of the loop-back testing are all matches, wherein the apparatus is to identify a first delay value for which one or more of the results of the loop-back testing are mismatches and a second delay value for which all of the results of the loop-back testing are mismatches. In some embodiments, the apparatus further includes a mismatch counter, wherein the apparatus is to commence counting by the mismatch counter when the first delay value is identified and to halt counting by the mismatch counter when the second delay value is identified.

In some embodiments, the delay line includes a plurality of delay stages and a plurality of taps to obtain the delay values from the plurality of delay stages. In some embodiments, each of the plurality of delay stages includes an inverter or buffer. In some embodiments, the apparatus includes a calibration element for calibration of the delay values for the delay line. In some embodiments, the calibration element includes logic to compare a phase of the transmit clock with the phases of outputs of the plurality of taps of the delay line. In some embodiments, the calibration element includes a stage to operate as a ring oscillator across the delay line.

In some embodiments, a method includes incrementing a counter to choose a series of delay values of an on-chip delay line for loopback testing of at least one I/O buffer circuit of an apparatus; and determining whether test data transmitted by a transmitter of the at least one buffer circuit at each of the series of delay values is a match or mismatch with test data received by a respective coupled receiver of the buffer circuit. In some embodiments, the transmitter and receiver of the at least one buffer circuit are coupled for loop-back testing.

In some embodiments, the loop-back testing includes testing with a first sweep of delay values wherein the counter counts down from a first initial delay value and testing with a second sweep of delay values wherein the counter counts down from a second initial delay value. In some embodiments, the first initial delay value is a delay value for which the results of the loop-back testing are all matches, and further comprising identifying a first delay value for which one or more of the results of the loop-back testing are mismatches. In some embodiments, the second initial delay value is a delay value for which the results of the loop-back testing are all mismatches, and the method includes identifying a first delay value for which one or more of the results of the loop-back testing are matches.

In some embodiments, the loop-back testing includes testing with a single sweep of delay values wherein the counter counts down from an initial delay value. In some embodiments, the initial delay value is a delay value for which the results of the loop-back testing are all matches, and the method including identifying a first delay value for which one or more of the results of the loop-back testing are mismatches and a second delay value for which all of the results of the loop-back testing are mismatches. In some embodiments, the method includes starting a mismatch count when the first delay value is identified and halting the mismatch count when the second delay value is identified.

In some embodiments, the method includes calibrating the delay values generated by the delay line. In some embodiments, the calibration of the delay values includes comparing a phase of a transmit clock input to the delay line with phases of outputs of a plurality of taps of the delay line. In some embodiments, the calibration of the delay values includes connecting a stage across the delay to operate as a ring oscillator.

In some embodiments, a system includes a processor to process data; a transmitter or receiver to transmit or receive data and an omnidirectional antenna for the transmission or reception of data; and a memory device for storing of data, the memory device including a plurality of I/O buffer circuits, each of the plurality of buffer circuits including a transmitter and a receiver that are coupled for loop-back testing, testing circuitry for the loop-back testing for the plurality of buffer circuits, the testing circuitry including a delay line to provide a plurality of delay values from a transmit clock signal for the testing of the plurality of buffer circuits, a counter to provide a count to choose one of the plurality of delay values, and test logic for the loop-back testing, and calibration circuitry to calibrate the delay values of the delay line.

In some embodiments, the loop-back testing includes a first sweep of delay values wherein the counter counts down from a first initial delay value and a second sweep of delay values wherein the counter counts up from a second initial delay value. In some embodiments, first initial delay value is a delay value for which the results of the loop-back testing are all matches and the second initial delay value is a delay value for which the results of the loop-back testing are all mismatches, the memory device to identify a first delay value for which one or more of the results of the loop-back testing are mismatches and a first delay value for which one or more of the results of the loop-back testing are matches.

In some embodiments, the loop-back testing includes a single sweep of delay values wherein the counter counts down from an initial delay value. In some embodiments, the initial delay value is a delay value for which the results of the loop-back testing are all matches, the memory device to identify a first delay value for which one or more of the results of the loop-back testing are mismatches and a second delay value for which all of the results of the loop-back testing are mismatches.

In some embodiments, a computer-readable storage medium having stored thereon data includes sequences of instructions that, when executed by a processor, cause the processor to perform operations including choosing a series of delay values of an on-chip delay line for loopback testing of at least one I/O buffer circuit of an apparatus; and determining whether test data transmitted by a transmitter of the at least one buffer circuit at each of the series of delay values is a match or mismatch with test data received by a respective coupled receiver of the buffer circuit, wherein the transmitter and receiver of the at least one buffer circuit are coupled for loop-back testing.

What is claimed is:
1. An apparatus comprising:
a plurality of I/O buffer circuits, each of the plurality of buffer circuits including a transmitter and a receiver that are coupled for loop-back testing of the respective buffer circuit; and testing circuitry for the loop-back testing for the plurality of buffer circuits, the loop-back testing including determining whether test data transmitted by the transmitter of each buffer circuit matches test data received by the respective coupled receiver;

wherein the testing circuitry includes:

a delay line to provide a plurality of delay values from a transmit clock signal for the testing of the plurality of buffer circuits, a counter to provide a count to choose one of the plurality of delay values of the delay line as a current delay value for the delay line, wherein the counter provides for one of:

multiple sweeps of delay values for loop-back testing, the sweeps including a first sweep of delay values wherein the counter counts down to decrease the current delay value from a first initial delay value until a first result occurs at a first delay value and a second sweep of delay values wherein the counter counts up to increase the current delay value from a second initial delay value until a second result occurs at a second delay value; or a single sweep of delay values for loop-back testing wherein the counter counts down to decrease the current delay value from the first initial delay value, the single sweep including determining that a first result occurs at a first delay value, the single sweep counting down until a second result occurs at a second delay value, and test logic for the loop-back testing, wherein the test logic is to determine whether results of the loop-back testing for each of the buffer circuits are matches or mismatches, the test logic including a first logic configured to determine whether or not all results of the loop-back testing for the plurality of buffer circuits are matches for the current delay value and a second logic configured to determine whether or not all results of the loop-back testing for the plurality of buffer circuits are mismatches for the current delay value;

wherein the apparatus is to determine a difference between the first delay value and the second delay value, the first delay value being identified using the first logic and the second delay value being identified using the second logic.

2. The apparatus of claim 1, further comprising a multiplexer, the multiplexer to receive the count from the counter to choose one of the plurality of delay values.

3. The apparatus of claim 1, wherein the first initial delay value is a delay value for which the results of the loop-back testing are all matches and the second initial delay value is a delay value for which the results of the loop-back testing are all mismatches.

4. The apparatus of claim 3, wherein the loopback testing includes multiple sweeps of delay values and wherein:

the apparatus is to utilize the first logic in the first sweep of delay values to identify the first delay value as a delay value for which one or more of the results of the loop-back testing are first determined to be mismatches.

5. The apparatus of claim 4, wherein:

the apparatus is to utilize the second logic in the second sweep of delay values to identify the second delay value as a delay value for which one or more of the results of the loop-back testing are first determined to be matches.

6. The apparatus of claim 3, wherein the loopback testing includes a single sweep of delay values, and wherein:

the apparatus is to identify, using the first logic, the first delay value as a delay value for which one or more of the results of the loop-back testing are first determined to be mismatches; and the apparatus is to identify, using the second logic, the second delay value as a delay value for which all of the results of the loop-back testing are first determined to be mismatches.

7. The apparatus of claim 6, further comprising a mismatch counter, wherein the apparatus is to commence counting by the mismatch counter when the first delay value is identified using the first logic and to halt counting by the mismatch counter when the second delay value is identified using the second logic.

8. The apparatus of claim 1, wherein the delay line includes a plurality of delay stages and a plurality of taps to obtain the delay values from the plurality of delay stages.

9. The apparatus of claim 8, wherein each of the plurality of delay stages includes an inverter or buffer.

10. The apparatus of claim 8, further comprising a calibration element for calibration of the delay values for the delay line.

11. The apparatus of claim 10, wherein the calibration element includes logic to compare a phase of the transmit clock with the phases of outputs of the plurality of taps of the delay line.

12. The apparatus of claim 10, wherein the calibration element includes a stage to operate as a ring oscillator across the delay line.

13. A method comprising:

incrementing a counter to choose a series of delay values of an on-chip delay line as a current delay value for loop-back testing of a plurality of I/O buffer circuits of an apparatus, wherein the counter provides for one of:

multiple sweeps of delay values for loop-back testing, the sweeps including a first sweep of delay values wherein the counter counts down to decrease the current delay value from a first initial delay value until a first result occurs at a first delay value and a second sweep of delay values wherein the counter counts up to increase the current delay value from a second initial delay value until a second result occurs at a second delay value, or a single sweep of delay values for loop-back testing wherein the counter counts down to decrease the current delay value from the first initial delay value, the single sweep including determining that a first result occurs at a first delay value, the single sweep counting down until a second result occurs at a second delay value; and determining using test logic whether test data transmitted by a transmitter of each of the buffer circuits at each of the series of delay values is a match or mismatch with test data received by a respective coupled receiver of the buffer circuit, the test logic including a first logic configured to determine whether or not all results of the loop-back testing for the plurality of buffer circuits are matches for the current delay value and a second logic configured to determine whether or not all results of the loop-back testing for the plurality of buffer circuits are mismatches for the current delay value;

determining a difference between the first delay value and the second delay value, the first delay value being identified using the first logic and the second delay value being identified using the second logic;

wherein the transmitter and receiver of each of the buffer circuits are coupled for loop-back testing.

14. The method of claim 13, wherein the first initial delay value is a delay value for which the results of the loop-back testing are all matches and the second initial delay value is a delay value for which the results of the loop-back testing are all mismatches.

15. The method of claim 14, wherein the loopback testing includes multiple sweeps of delay values, and the method further comprising:
identifying, utilizing the first logic in the first sweep of delay values, the first delay value as a delay value for which one or more of the results of the loop-back testing are first determined to be mismatches.

16. The method of claim 15, wherein the method further comprising:
identifying, utilizing the second logic in the second sweep of delay values, the first delay value as a delay value for which one or more of the results of the loop-back testing are first determined to be matches.

17. The method of claim 14, wherein the loopback testing includes a single sweep of delay values, and wherein the method further comprises:
identifying, utilizing the first logic, the first delay value as a delay value for which one or more of the results of the loop-back testing are first determined to be mismatches, and
identifying, utilizing the second logic, the second delay value as a delay value for which all of the results of the loop-back testing are first determined to be mismatches.

18. The method of claim 17, further comprising starting a mismatch count when the first delay value is identified and halting the mismatch count when the second delay value is identified.

19. The method of claim 13, further comprising calibrating the delay values generated by the delay line.

20. The method of claim 19, wherein the calibration of the delay values includes one of comparing a phase of a transmit clock input to the delay line with phases of outputs of a plurality of taps of the delay line; or connecting a stage across the delay to operate as a ring oscillator.

21. A system comprising:
a processor to process data;
a transmitter or receiver to transmit or receive data and an omnidirectional antenna for the transmission or reception of data; and
a memory device for storing of data, the memory device including:
a plurality of I/O buffer circuits, each of the plurality of buffer circuits including a transmitter and a receiver that are coupled for loop-back testing for the respective buffer circuit,
testing circuitry for the loop-back testing for the plurality of buffer circuits, the testing circuitry including:
a delay line to provide a plurality of delay values from a transmit clock signal for the testing of the plurality of buffer circuits,
a counter to provide a count to choose one of the plurality of delay values of the delay line as a current delay value for the delay line, wherein the counter provides for one of:
multiple sweeps of delay values for loop-back testing, the sweeps including a first sweep of delay values wherein the counter counts down to decrease the current delay value from a first initial delay value until a first result occurs at a first delay value and a second sweep of delay values wherein the counter counts up to increase the current delay value from a second initial delay value until a second result occurs at a second delay value, or
a single sweep of delay values for loop-back testing wherein the counter counts down to decrease the current delay value from the first initial delay value, the single sweep including determining that a first result occurs at a first delay value, the single sweep counting down until a second result occurs at a second delay value; and
test logic for the loop-back testing, wherein the test logic is to determine whether results of the loop-back testing for each of the buffer circuits are matches or mismatches, the test logic including a first logic configured to determine whether or not all results of the loop-back testing for the plurality of buffer circuits are matches for the current delay value and a second logic configured to determine whether all results of the loop-back testing for the plurality of buffer circuits are mismatches for the current delay value, wherein the test circuitry is to determine a difference between the first delay value and the second delay value, the first delay value being identified using the first logic and the second delay value being identified using the second logic, and
calibration circuitry to calibrate the delay values of the delay line.

22. The system of claim 21, wherein the first initial delay value is a delay value for which the results of the loop-back testing are all matches and the second initial delay value is a delay value for which the results of the loop-back testing are all mismatches.

23. The system of claim 22, wherein the loopback testing includes multiple sweeps of delay values and wherein:
the memory device is to identify using, the first logic in the first sweep of delay values, the first delay value as a delay value for which one or more of the results of the loop-back testing are first determined to be mismatches, and
the memory device is to identify, using the second logic in the second sweep of delay values, the second delay value as a delay value for which one or more of the results of the loop-back testing are first determined to be matches.

24. The system of claim 22, wherein the loopback testing includes a single sweep of delay values, and wherein:
the memory device is to identify, using the first logic, the first delay value as a delay value for which one or more of the results of the loop-back testing are first determined to be mismatches, and
the memory device is to identify, using the second logic, the second delay value as a delay value for which all of the results of the loop-back testing are first determined to be mismatches.

25. A non-transitory computer-readable storage medium having stored thereon data representing sequences of instructions that, when executed by a processor, cause the processor to perform operations comprising:
incrementing a counter to choose a series of delay values of an on-chip delay line as a current delay value for loop-back testing of each of a plurality of I/O buffer circuits of an apparatus, wherein the counter provides for one of:
multiple sweeps of delay values for loop-back testing, the sweeps including a first sweep of delay values wherein the counter counts down to decrease the current delay value from a first initial delay value until a first result occurs at a first delay value and a second sweep of delay values wherein the counter counts up to increase the current delay value from a second initial delay value until a second result occurs at a second delay value, or a single sweep of delay values for loop-back testing wherein the counter counts down to decrease the current delay value from the first initial delay value, the single sweep including determining that a first result occurs at a first delay value, the single sweep counting down until a second result occurs at a second delay value; and determining using test logic whether test data transmitted by a transmitter of each of the buffer circuits at each of the series of delay values is a match or mismatch with test data received by a respective coupled receiver of the buffer circuit, the test logic including a first logic configured to determine whether or not all results of the loop-back testing are matches for the current delay value and a second logic configured to determine whether or not all results of the loop-back testing are mismatches for the current delay value;

determining a difference between the first delay value and the second delay value, the first delay value being identified using the first logic and the second delay value being identified using the second logic;

wherein the transmitter and receiver of each of the buffer circuits are coupled for loop-back testing.

26. The apparatus of claim 1, wherein the apparatus includes an integrated circuit, and wherein the apparatus is configured to conduct the loop-back testing at one or more of when there are no package pins connected to the integrated circuit or when the integrated circuit resides on a die that has not yet been assembled with any other die.

27. The method of claim 13, wherein the apparatus includes an integrated circuit, and wherein the loop-back testing is performed during wafer probe testing.

* * * * *